US010156611B2

(12) United States Patent
Eracar et al.

(10) Patent No.: US 10,156,611 B2
(45) Date of Patent: Dec. 18, 2018

(54) EXECUTING CODE ON A TEST INSTRUMENT IN RESPONSE TO AN EVENT

(71) Applicant: Teradyne, Inc., North Reading, MA (US)

(72) Inventors: Yonet A. Eracar, Andover, MA (US); Michael Francis McGoldrick, North Reading, MA (US); Stephan Krach, North Billerica, MA (US)

(73) Assignee: Teradyne, Inc., North Reading, MA (US)

( * ) Notice: Subject to any disclaimer, the term of this patent is extended or adjusted under 35 U.S.C. 154(b) by 761 days.

(21) Appl. No.: 14/024,949

(22) Filed: Sep. 12, 2013

(65) Prior Publication Data

US 2015/0074653 A1 Mar. 12, 2015

(51) Int. Cl.
*G01R 31/319* (2006.01)
*G06F 11/273* (2006.01)
*G06F 9/44* (2018.01)

(52) U.S. Cl.
CPC ...... *G01R 31/31908* (2013.01); *G06F 11/273* (2013.01); *G01R 31/31919* (2013.01)

(58) Field of Classification Search
None
See application file for complete search history.

(56) References Cited

U.S. PATENT DOCUMENTS

| | | | | |
|---|---|---|---|---|
| 4,271,515 A | * | 6/1981 | Axtell, III | G01R 31/2834 702/117 |
| 6,128,759 A | * | 10/2000 | Hansen | 714/738 |
| 8,305,903 B1 | * | 11/2012 | Louise | G06F 15/00 370/241 |
| 8,775,986 B1 | * | 7/2014 | Mohan et al. | 716/104 |
| 9,626,263 B2 | * | 4/2017 | Senf | G05B 23/0256 |
| 2009/0070374 A1 | * | 3/2009 | Eker et al. | 707/104.1 |
| 2010/0325622 A1 | * | 12/2010 | Morton | 717/168 |
| 2012/0204153 A1 | * | 8/2012 | Peterson et al. | 717/124 |
| 2013/0110445 A1 | | 5/2013 | Kaushansky et al. | |

(Continued)

OTHER PUBLICATIONS

IAR, "Getting Started with IAR Embedded Workbench." IAR Systems. N.p., Oct. 2009. Web. Nov. 6, 2014. <http://supp.iar.com/FilesPublic/UPDINFO/004916/common/doc/EW_GettingStarted.ENU.pdf>.*

(Continued)

*Primary Examiner* — Wei Y Zhen
*Assistant Examiner* — Binh K Luu
(74) *Attorney, Agent, or Firm* — Choate, Hall & Stewart LLP (57) ABSTRACT

Automatic test equipment (ATE) may include: a test instrument to implement a communication protocol to communicate to a unit under test (UUT), where the test instrument is memory storing bytecode that is executable, and where the test instrument being configured to identify an event in communication between the test instrument and the UUT and, in response to the event, to execute the bytecode. The ATE may also include a test computing system to execute a test program and an editor program, where the editor program is for receiving human-readable code and for generating the bytecode from the human-readable code, and the test program is for registering the event with the test instrument and for downloading the bytecode to the test instrument for storage in the memory.

24 Claims, 3 Drawing Sheets

(56) References Cited

U.S. PATENT DOCUMENTS

2013/0110446 A1    5/2013    Bourassa et al.
2013/0111505 A1    5/2013    Frick et al.

OTHER PUBLICATIONS

Xilinx, "AXI Bus Functional Model v1.9." Xilinx. N.p., Jun. 22, 2011. Web. Nov. 6, 2014. <http://httpchina.xilinx.comsupportdocumentationip_documentationcdn_axi_bfmv1_9pb001_axi_bfm.pdf>.*

Digilent, "Xilinx ISE Simulattor (ISim) VHDL Test Bench Tutorial." Digilent Inc. N.p., Feb. 27, 2010. Web. Nov. 6, 2014. <http://www.digilentinc.com/Data/Documents/Tutorials/Xilinx%20ISE%20Simulator%20(ISim)%20VHDL%20Test%20Bench%20Tutorial.pdf>.*

Olson, David. "Tutorial 06: Getting the Bugs Out." Blogspot. N.p., Jul. 17, 2010. Web. Nov. 6, 2014. <http://mspsci.blogspot.com/2010/07/tutorial-06-getting-bugs-out.html>.*

Shute, Gary. "Debugging and Testing." University of Minnesota Duluth. N.p., Jan. 9, 2009. Web. Sep. 11, 2015. <http://web.archive.org/web/20090109142614/http://www.d.umn.edu/~gshute/softeng/testing.html>.*

* cited by examiner

EXECUTING CODE ON A TEST INSTRUMENT IN RESPONSE TO AN EVENT

TECHNICAL FIELD

This specification relates generally to executing code on a test instrument in response to an event.

BACKGROUND

ATE refers to an automated, usually computer-driven, system for testing devices, such as semiconductors, electronic circuits, and printed circuit board assemblies. A device tested by ATE is referred to as a unit under test (UUT).

ATE typically includes a computer system and a test instrument or a single device having corresponding functionality. ATE is capable of providing test signals to a UUT, receiving response signals from the UUT, and forwarding those response signals for processing to determine whether the UUT meets testing qualifications.

In many test applications, particularly those involving high speed digital data buses, the time required to receive data from a UUT, process that data, and provide a response to the UUT may be small enough to preclude use of a computer system controlling the overall ATE, even if the nature of that data processing is not complex. In these situations, test program set (TPS) developers may use local computing power that is embedded in the test instrument. Developing TPSs to run on this embedded computing power can be difficult and involve purchasing additional software tools beyond what is provided with the ATE.

SUMMARY

Example automatic test equipment (ATE) may comprise: a test instrument to implement a communication protocol to communicate to a unit under test (UUT), where the test instrument comprises memory storing bytecode that is executable, and where the test instrument is configured to identify an event in communication between the test instrument and the UUT and, in response to the event, to execute the bytecode; and a test computing system to download the bytecode to the test instrument for storage in the memory. The example ATE may include one or more of the following features, either alone or in combination.

The test computing system may be configured to execute a test program and an editor program. The editor program may operate to receive human-readable code and to generate the bytecode from the human-readable code, and the test program may operate to register the event with the test instrument and to download the bytecode to the test instrument for storage in the memory.

The test instrument may comprise: one or more embedded processing devices to implement the communication protocol, to identify the event, and to run a code interpreter to execute the bytecode; and interface circuitry between the one or more embedded processing devices and the UUT.

The memory may store multiple instances of bytecode that are each executable. The test instrument may be configured to identify multiple events and, in response to an event, the test instrument may be configured to execute bytecode corresponding to the event. Execution of the bytecode may affect real-time communication between the test instrument and the UUT.

The test computing system may be configured to execute a test program what comprises code registration functions to register events with the test instrument via an application programming interface (API) of the test instrument. The editor program may comprise: a text editor to produce the human-readable code; a compiler to compile the human-readable code to generate the bytecode; a code interpreter to execute the bytecode on the test computing system; and a debugger to debug the bytecode on the test computing system in a simulation mode. The text editor and the debugger combined may enable one or more of the following operations: to view at least a portion of the bytecode with corresponding human-readable source code lines, to step-through the bytecode, to identify breakpoints in the bytecode, and to perform monitoring functions for a memory stack and variables associated with the bytecode.

The test instrument may be configured by storing, on the test instrument, a real-time communication application to implement the communication protocol, to identify the event, and to execute the bytecode.

The memory may store multiple instance of bytecode that are executable. The test instrument may be configured to execute an instance of bytecode in response to a single occurrence of the event.

The human-readable code may be written in a scripting language. The test computing system may comprise multiple computing devices.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Manufacturers may test devices at various stages of manufacturing. In an example manufacturing process, integrated circuits are fabricated in large quantities on a single silicon wafer. The wafer is cut into individual integrated circuits called dice. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many manufacturers test integrated circuits at the wafer level, before a wafer is cut into dice. Defective circuits are marked and generally discarded prior to packaging, thus saving the cost of packaging defective dice. As a final check, many manufacturers test each finished product before it is shipped. Such a process tests parts in packages which have had additional expense added to them over bare die. So, having accurate test results reduces the need to discard valuable parts.

To test quantities of components, manufacturers commonly use ATE (or "testers"). In response to instructions in a test program set (TPS), some ATE automatically generates input signals to be applied to a UUT, and monitors output signals. The ATE compares the output signals with expected responses to determine whether the UUT is defective. ATE typically includes a computer system and a test instrument or a single device having corresponding functionalities.

In an example implementation, ATE includes the following components: support for a human-readable scripting language that provides native capabilities for test instrument control in addition to data processing and flow of control capabilities; an editor program to convert a computer program written in a human-readable (e.g., scripting) language to bytecode; a mechanism to download the bytecode to the test instrument as part of an executing TPS; and an interpreter program that runs on one or more embedded processing devices (a single embedded processing device is described for illustration) in the test instrument and that is invoked at specified events during the execution of a TPS, and that, as part of its interpretation of the bytecode, can update the state of the test instrument and/or the test instrument's embedded processing device.

In some implementations, a TPS contains code that controls the setup and execution of one or more test instruments contained in the test system configuration. Control of the test instruments in the test system is typically done using an application programming interface (API) provided by the test instrument manufacturer. A test instrument's API either directly manipulates the test instrument, or communicates with a computer program called a real-time application executing on the test instrument's embedded processing device. The real-time application is responsible for controlling how the test instrument interacts with a UUT during the execution of a TPS. Typically, the TPS initiates execution of the real-time application, but the real-time application runs autonomously, once started.

In example ATE, in addition to writing code for the TPS, a TPS developer writes code (e.g., script) source files that contain definitions of test routines to be invoked in response to events occurring during the execution of the real-time application on the test instrument's embedded processing device. The events may be defined beforehand by the TPS developer. The association between an event and a routine may be implemented in the TPS code using registration functions from the test instrument's API. Not all events require a routine, and more than one routine may be associated with a particular event or events.

What the events are depends on the particular real-time application. In some implementations, a real-time application might communicate with a UUT by exchanging data messages with that UUT. Some example events for such a real-time application may include, but are not limited to, identification of a time just prior to sending a data message to the UUT (to provide an opportunity to make last-minute changes to the data to be sent in the message) and identification of a time immediately after a message is received from the UUT (to provide an opportunity to act on the contents of that message). There may also be other events.

When an event is reached during execution of the real-time application, the real-time application instructs an interpreter program to begin executing a routine associated with that event, if such a routine has been registered in the TPS. The interpreter program may be a standardized software component that executes under the direction of the real-time application (meaning, e.g., that the same interpreter program component can be used with any appropriate real-time application).

In some implementations, event handlers in the real-time application are used to start execution of bytecode on the test instrument. The event handlers are computer programs (or portions thereof) that execute in parallel and overlap in execution (because, e.g., the event handlers happen to be invoked by tasks executing in parallel). Hooks are provided from the real-time application back to the executing TPS via event notifications and shared data. Running the real-time application and customizable code on the test instrument can make it easier to perform operations such as, but not limited to, computing checksums or cyclic redundancy checks (CRCs), updating specific fields in a repeating message, echoing received data, and counting event occurrences.

The bytecode that is produced from the source code files and downloaded into the test instrument's memory is in a machine-readable format. In some implementations, the bytecode includes a sequential series of instructions in binary form, which the interpreter program can execute.

In some implementations, a scripting language is used as the human-readable language, and provides common data types (integer, real, and string), data structures (arrays, records), and flow control constructs (procedures, functions, conditional statements, and loops). In addition, the scripting language supports specialized constructs and event processing mechanisms that are usable in real-time applications (timers, counters, queues). A set of built-in functions (math, string manipulation, data conversion/manipulation) may simplify programming in this scripting language. In some implementations, the scripting language may be replaced with any appropriate known programming language including, but not limited to, the "C" programming language.

The editor program provides an integrated environment to produce and compile source code files into bytecode, such as machine-readable bytecode files. In some implementations, the editor program includes three main components: (1) a context-sensitive text editor that can be used to create source code files and to view the generated bytecode during debugging, (2) a compiler/builder to compile the source code files and to build bytecode files upon successful compilation, and (3) a debugger that is similar to the interpreter program that executes the bytecode files in the embedded processing device, but that executes on the test computer and not on the test instrument. In this regard, in addition to producing a bytecode file, the compiler may generate a debug information file that allows the TPS developer to debug the generated bytecode file on the test computer before executing on the test instrument. The debugger allows the TPS developer to emulate and monitor test instrument processor memory and execute a user-written script routine in debugging mode. The text editor and debugger combined enable one or more of the following operations: to view at least a portion of the bytecode with corresponding human-readable source code lines, to step-through the bytecode, to identify breakpoints in the bytecode, and to perform monitoring functions for a memory stack and variables associated with the bytecode.

In some implementations, the debugging environment on a test computing system uses the same interpreter program (albeit a different copy of that program) that the actual real-time application on the test instrument uses. This may allow TPS developers not experienced in embedded programming to develop and debug real-time applications and avoid costs accrued due to expensive embedded development tools, steep learning curves, and the relatively slow nature of conventional embedded development.

Figure 1:
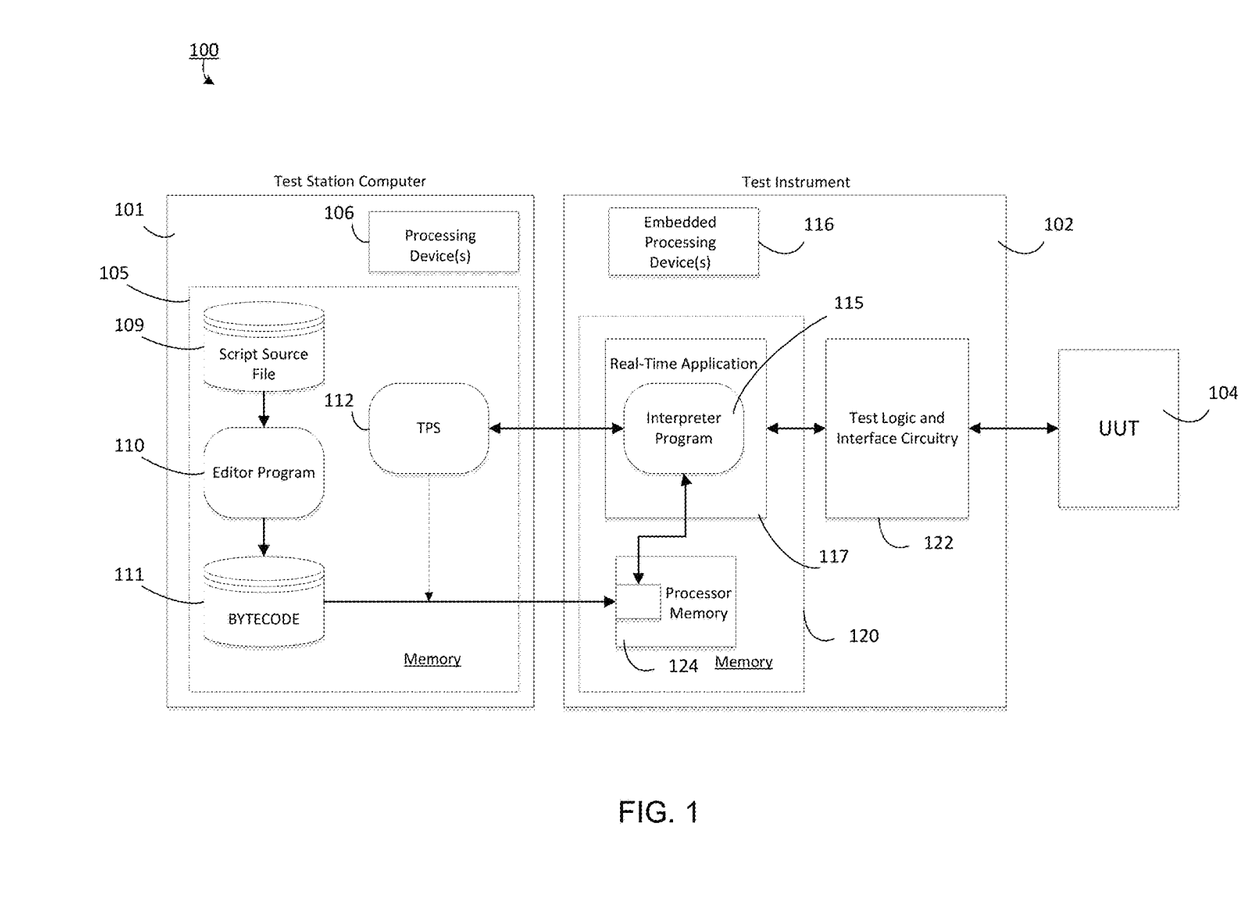
FIG. 1 is an example of architecture of an ATE test system.

FIG. 1 shows an example implementation of ATE 100, which includes the functionality described above. As shown, ATE 100 includes a test station computer 101 and one or more test instruments, such as test instrument 102. In some implementations, test station computer 101 is part of a test computing system that includes multiple computing devices (e.g., networked desktop computers, mainframe computers, wireless devices, and so forth).

The examples described herein attribute the functionality described with respect to FIG. 1 to the test station computer. However, in other example implementations, all or part of that functionality may be performed by computing devices, which are part of the test computing system, but which are not the test station computer. In some examples, all or part the functions described herein, which are attributed to the test station computer, may be distributed among multiple computing devices in the test computing system.

In some implementations, test instrument 102 is configured to communicate directly to UUT 104. UUT 104 may be any type of device that can be tested by ATE, and is not limited to the examples described herein. Accordingly, communications between test station computer 101 and UUT 104 occur via test instrument 102. In this regard, in some implementations, test station computer 101 programs test instrument 102, test instrument 102 runs one or more tests on UUT 104, and test instrument 102 communicates the results of those test to test station computer 101. In some implementations, there is no interaction between test station computer 101 and test instrument 102 while the tests are being run on the UUT. In other implementations, there may be communication between test station computer 101 and test instrument 102 while the tests are being run on the UUT. For example, the test station computer may receive information from the test instrument during test, and may provide information back to the test instrument in response. In some implementations, test station computer 101 may interject information during running of tests without first being prompted by test instrument 102.

In the example architecture of FIG. 1, test station computer 101 may include any appropriate type of computing device, such as one or more mainframe computers, networked desktop computers, and/or mobile computing devices. In this example, test station computer 101 includes memory 105 containing data, files, and executable computer programs, among other things. Test station computer 101 also includes one or more processing devices 106, such as microprocessor(s), programmed FPGAs, or the like, that are capable of executing the computer programs to perform functions, including the example functions described herein that are attributed to test station computer 101.

Test station computer 101 includes human-readable script source files 109. These files constitute support for, and enable use of, the human-readable scripting language used to generate programs that are executable on the test instrument to respond to events. In some implementations, any appropriate computing language may be used instead of the human-readable scripting language described herein.

Editor program 110 is an example of the editor program described above, and includes the functionalities described herein. Generally, editor program 110 allows a user, such as a test engineer, to access the script source files and to generate one or more computer programs that can be run on the test instrument or elsewhere. For example, editor program 110 allows a user to generate a test routine (e.g., executable code constituting a computer program or portion thereof) to automatically respond to one or more events, such as a particular type of, or subject of, communication from the UUT. For example, the test routine may respond to a request for data from the UUT, to a positive or negative test result from the UUT, to an expected response from the UUT, or to any other appropriate communication from the UUT to the test instrument before, during or after all or part of testing.

Editor program 110 may also include a compiler to compile test routines written by the user to produce corresponding instances of bytecode (e.g., machine-readable code that is executable on the test instrument). The compiler may store the bytecode as bytecode files 111 in memory. Each bytecode file may be executed in response to one or more events on test instrument 102. The association between an event and a bytecode routine may be implemented in TPS code 112 using registration functions from the test instrument's API.

As shown in FIG. 1, TPS code 112 may communicate, via the test instrument's API, with interpreter program 115 executing on embedded processing device 116 in the test instrument. This communication may include identifying which user-generated test routines (in the form of bytecode) to execute in response to specific events identified by the test instrument. As described in more detail below, interpreter program 115 is part of a real-time application 117 that implements a communication protocol to enable test instrument 102 to communicate with UUT 104 (e.g., during test). The events may be identified by event handlers in the real-time application or by other methods. In some implementations, the interpreter program is part of the real-time application (as shown), and in other implementations, the interpreter program is separate from the real-time application.

As indicated above, in some implementations, editor program 110 also includes the following modules: (1) a context-sensitive text editor that can be used to create source code files and to view the generated bytecode during debugging, (2) a compiler/builder to compile the source code files and to build bytecode files upon successful compilation, (3) a code interpreter that is similar to the interpreter program that executes the bytecode files in the embedded processing device, but that executes, in a simulation mode, on the test computer and not on the test instrument, and (4) a debugger that interacts with the code interpreter to enable debugging of the bytecode. In some implementations, the debugger is a computer program that allows user-generated routines that are to be run on the test instrument to be run on the test station computer in a simulation mode to determine if those routines operate properly. The debugger may include, but is not limited to, the debugging features described above, which enable a user to correct errors in the routines, where applicable. To reiterate, the debugging features include, but are not limited to, functions to view at least a portion of the bytecode with corresponding human-readable source code lines, to step-through the bytecode, to identify breakpoints in the bytecode, and to perform monitoring functions for a memory stack and variables associated with the bytecode.

Test instrument 102 includes one or more embedded processing devices 116 and memory 120 to store data and computer programs that are executable by the one or more embedded processing devices. There may be one or more embedded processing device(s) in each ATE. The embedded processing devices may operate as companion processing devices or they may be tiered, as described in U.S. application Ser. No. 13/284,378, filed on Oct. 28, 2011, the contents of which are incorporated herein by reference as if set forth herein in full. The embedded processing devices (or a set thereof) may be resident on a card in a test instrument, thereby allowing the test instrument to test multiple UUTs in parallel. In the example described herein, execution in a test instrument takes place on a single embedded processing device; however, in other implementations, execution of any one or more executables may take places on more than one processing device.

The computer programs include real-time application 117 for implementing a communication protocol to communicate with UUT 104. Real-time application 117 includes event handlers to identify events that occur during communication with the UUT and to identify a corresponding test routine (e.g., in the form of bytecode) that is to be run in response to an event, and an interpreter program 115 to run the corresponding test routine in response to the event. Following execution of the test routine, the real-time application may complete the testing process (if the event response does not constitute completion), and report the test results to the test station computer.

In the example implementation of FIG. 1, test instrument 102 also includes logic and interface circuitry 122. Logic and interface circuitry 122 may include, for example, buffers, analog/digital converters, drivers, pins, and any other circuitry appropriate for use in exchanging signals with UUT 104. Test instrument 102 may also include other circuitry, memory and/or processing devices (not shown).

Figure 2:
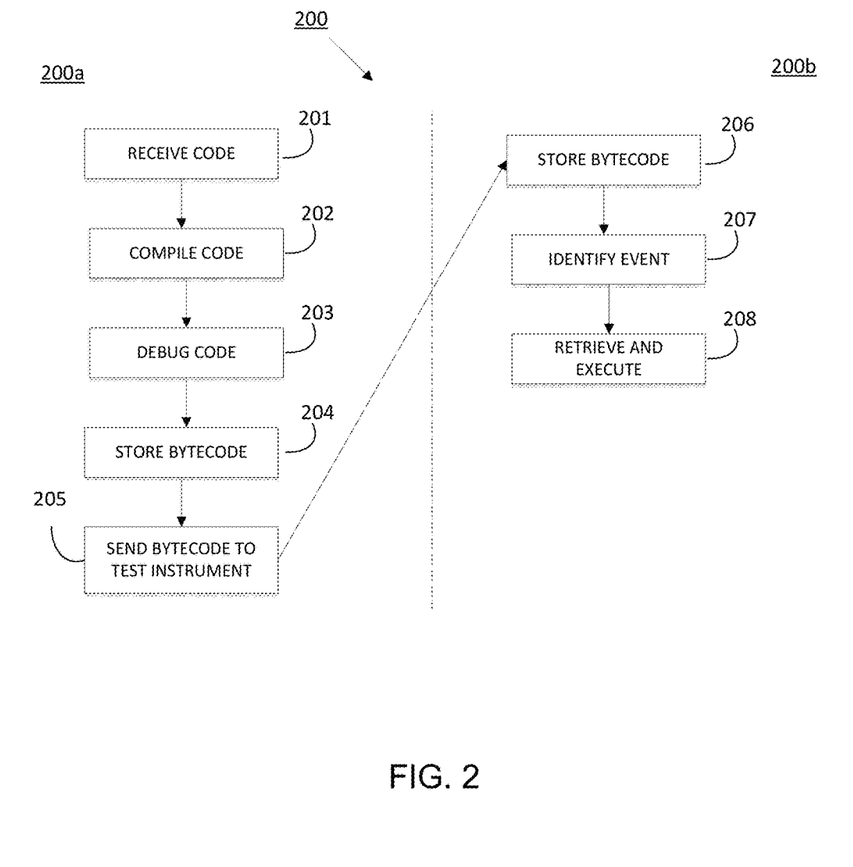
FIG. 2 is an example of a process performed by the ATE test system.

FIG. 2 is a flowchart showing an example of a process 200 that may be performed by ATE 100. Process 200 includes a part 200a that may be performed by test station computer 101 and a part 200b that may be performed by test instrument 102. In other implementations, the operations shown in FIG. 2 may be performed by different entities than those indicated in the figure.

Process 200 includes receiving (201) human-readable code for a test routine from a user. The human-readable code may be in a scripting language that includes features specific to test instruments or it may be in a common computing language, such as "C". The human-readable code may be received (201) via editor program 110. For example, a user may access editor program 110, generate a test routine using some (or none) of the code in source file 109, and indicate that the generated test routine is to be executed in test instrument in response to one or more events, which the user also identifies to the editor program.

The editor program may compile (202) the code for the test routine to produce bytecode and, at the request of the user, may run its own interpreter program to debug (203) the code. For example, the test routine may be subjected to test inputs and the outputs thereof compared to expected outputs. If the two do not match, the debugger may be used to isolate sections of the bytecode defining the test routine and human-readable code responsible for the faulty output, and provide a mechanism to correct that code, and retest the code.

After the operation of the code has been verified, in response to user input the corresponding bytecode may be stored (204) in a bytecode file 111 on test station computer 101. The bytecode may be sent (205) from the bytecode file 111 to memory 124 on the test instrument. The transfer may be performed, e.g., at the instruction of TPS 112. At some point following verification of the code's operation, TPS 112 may also register the event corresponding to the bytecode with the test instrument. Registration may be performed via the test instrument's API, which allows the TPS to communicate the identity of the event and corresponding bytecode (in memory on the test instrument) to real-time application 117.

Test instrument 102 receives the bytecode from test station computer 101 and stores (206) the bytecode in memory 124. During communication orchestrated by real-time application 117, real-time application 117 identifies (207) an event that triggers execution of bytecode. An event handler may perform the identification. For example, the event may be start of a communication, end of a communication, identification of a particular result in a communication, and so forth. In response to the event, interpreter program 115 retrieves, and executes, (208) bytecode corresponding to the event. In some implementations, the execution may be interactive, in that it may allow a user or TPS 112 to add, remove, or change data being passed between the test instrument and UUT. In some implementations, the execution may not be interactive, in that the test routine may generate, add, remove and/or modify data without user or TPS interaction.

Following, or as a result of, execution of the test routine by interpreter program 115, communication with, and testing of, the UUT may resume.

Figure 3:
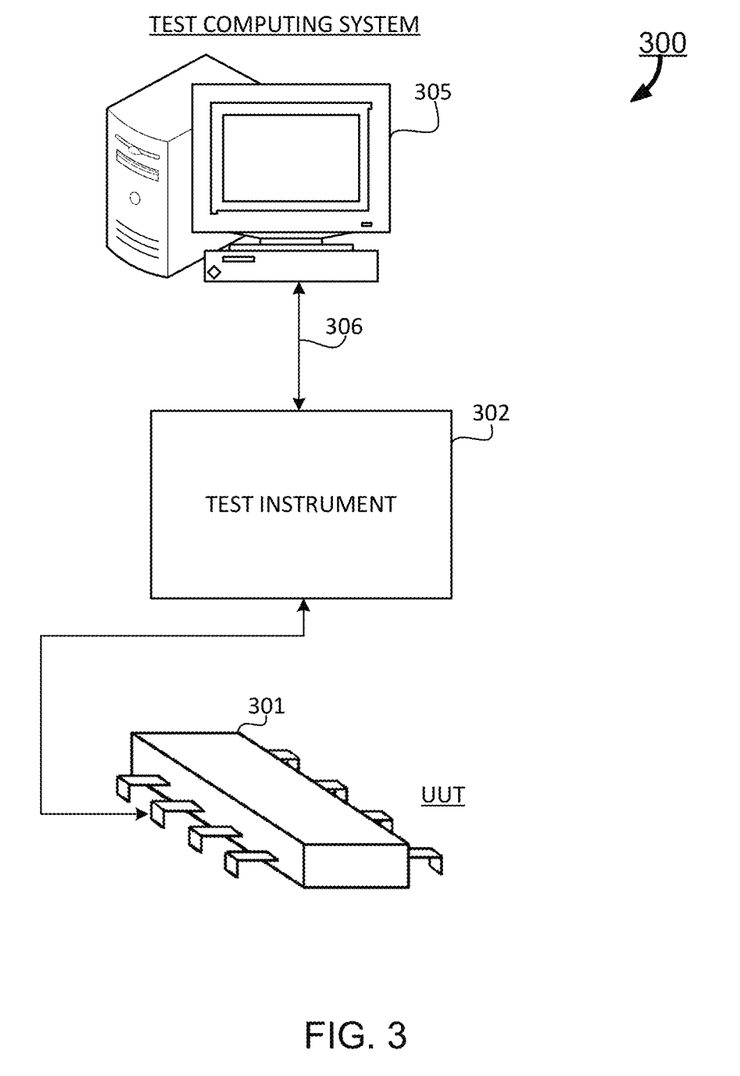
FIG. 3 is a block diagram of an example test system that may be used to implement the example architecture of FIG. 1.

Referring now to FIG. 3, that figure shows an example of a test system on which the architecture of FIG. 1 may be implemented. FIG. 3 shows an example test system 300 for testing a UUT 301. Test system 300 includes a test instrument 302 and a computer system 305 that interfaces with test instrument 302 over one or more communications media, such as a network connection 306, a control bus, and/or one or more other wired or wireless transmission media. As noted below, computer system 305 may incorporate the functionality of test station computer 101 (FIG. 1). Typically, computer system 305 sends commands to test instrument 302 to initiate execution of routines and programs for testing UUT 301. Such executing test programs may initiate the generation and transmission of test signals to the UUT 301 and collect responses from the UUT, as described above. Various types of UUTs may be tested by system 300. For example, UUTs may be avionics, radar, weaponry, semiconductor devices, and so forth.

To provide test signals and collect responses from the UUT, test instrument 302 is connected, via an appropriate hardware interface, to one or more connector pins that provide an interface for the internal circuitry of UUT 301. Test instrument 302 may incorporate the functionality of test instrument 102 (FIG. 1). For illustrative purposes, in this example, test instrument 302 is connected to a connector pin of UUT 301 via a hardwire connection to deliver test signals (to the internal circuitry of UUT 301). Test instrument 302 also senses signals at UUT 301 in response to the test signals provided by test instrument 302.

The computer system, or another processing device used on or associated with test system 300, may be configured to exchange communications with a real-time application running on test instrument 302 through active communication channels with the device tester. The computer system may be, or include, test station computer 101 of FIG. 1. Alternatively, computer 102 may be part of test instrument 302 and the computer system may communicate with computer 102.

Testing, as described herein, may be performed using a combination of system processing devices, embedded processing devices, and/or programmable logic. For example, each of these different elements may run on or more test programs simultaneously to test the same device or portion thereof.

In some implementations, programmable logic may be replaced with non-programmable logic. For example, rather than using an FPGA, one or more application-specific integrated circuits (ASICs) may be incorporated into the test instrument in place of, or in addition to, programmable logic.

While this specification describes example implementations related to "testing" and a "test system," the devices and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection". In examples, a connection may be wireless, e.g., RF, microwave, or fiber optic.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. Automatic test equipment (ATE) comprising:
a test instrument to implement a communication protocol to communicate to a unit under test (UUT) during testing of the UUT, the test instrument comprising memory storing bytecode that is executable by a real-time application configured to run on the test instrument, the real-time application being configured to identify an event in communication between the test instrument and the UUT and, in response to the event, to execute the bytecode; and
a test computing system to run a test program to affect data transfer between the test instrument and the UUT during the testing and to download the bytecode to the test instrument for storage in the memory, the test program being configured to register the event with the test instrument by communicating, to the real-time application, an identity of the event and corresponding bytecode for the event stored in the memory.

2. The ATE of claim 1, wherein the test computing system is configured to execute an editor program, the editor program to receive human-readable code and to generate the bytecode from the human-readable code, and the test program to download the bytecode to the test instrument for storage in the memory.

3. The ATE of claim 1, wherein the test instrument comprises:
one or more embedded processing devices to implement the communication protocol, to identify the event, and to run a code interpreter to execute the bytecode; and
interface circuitry between the one or more embedded processing devices and the UUT.

4. The ATE of claim 1, wherein the memory stores multiple instances of bytecode that are each executable, the test instrument is configured to identify multiple events and, in response to an event, the test instrument is configured to execute bytecode corresponding to the event.

5. The ATE of claim 3, wherein execution of the bytecode affects real-time communication between the test instrument and the UUT.

6. The ATE of claim 1, wherein the test program comprises code routine registration functions to register events with the test instrument via an application programming interface (API) of the test instrument.

7. The ATE of claim 2, wherein the editor program comprises:

a text editor to produce the human-readable code;
a compiler to compile the human-readable code to generate the bytecode;
a code interpreter to execute the bytecode on the test computing system; and
a debugger to debug the bytecode on the test computing system in a simulation mode.

8. The ATE of claim 7, wherein the text editor and the debugger combined enable one or more of the following operations: to view at least a portion of the bytecode with corresponding human-readable source code lines, to step-through the bytecode, to identify breakpoints in the bytecode, and to perform monitoring functions for a memory stack and variables associated with the bytecode.

9. The ATE of claim 1, wherein the test instrument is configured by storing, on the test instrument, the real-time application to implement the communication protocol, to identify the event, and to execute the bytecode.

10. The ATE of claim 1, wherein the memory stores multiple instance of bytecode that are executable, the test instrument being configured to execute an instance of bytecode in response to a single occurrence of the event.

11. The ATE of claim 2, wherein the human-readable code is written in a scripting language.

12. The ATE of claim 1, wherein the test computing system comprises multiple computing devices.

13. A method for use with automatic test equipment (ATE), comprising:
using a test instrument to implement a communication protocol to communicate to a unit under test (UUT) during testing of the UUT, the test instrument comprising memory storing bytecode that is executable by a real-time application configured to run on the test instrument, the real-time application being configured to identify an event in communication between the test instrument and the UUT and, in response to the event, to execute the bytecode; and
using a test computing system to run a test program to affect data transfer between the test instrument and the UUT during the testing and to download the bytecode to the test instrument for storage in the memory, the test program being configured to register the event with the test instrument by communicating, to the real-time application, an identity of the event and corresponding bytecode for the event stored in the memory.

14. The method of claim 13, wherein the test computing system is used to execute an editor program, the editor program to receive human-readable code and to generate the bytecode from the human-readable code, and the test program to download the bytecode to the test instrument for storage in the memory.

15. The method of claim 13, wherein the test instrument comprises:
one or more embedded processing devices to implement the communication protocol, to identify the event, and to run a code interpreter to execute the bytecode; and
interface circuitry between the one or more embedded processing devices and the UUT.

16. The method of claim 13, wherein the memory stores multiple instances of bytecode that are each executable, the test instrument is configured to identify multiple events and, in response to an event, the test instrument is configured to execute bytecode corresponding to the event.

17. The method of claim 16, wherein execution of the bytecode affects real-time communication between the test instrument and the UUT.

18. The method of claim 13, wherein the test program comprises code routine registration functions to register events with the test instrument via an application programming interface (API) of the test instrument.

19. The method of claim 14, wherein the editor program comprises:
a text editor to produce the human-readable code;
a compiler to compile the human-readable code to generate the bytecode;
a code interpreter to execute the bytecode on the test computing system; and
a debugger to debug the bytecode on the test computing system in a simulation mode.

20. The method of claim 19, wherein the text editor and the debugger combined enable one or more of the following operations: to view at least a portion of the bytecode with corresponding human-readable source code lines, to step-through the bytecode, to identify breakpoints in the bytecode, and to perform monitoring functions for a memory stack and variables associated with the bytecode.

21. The method of claim 13, wherein the test instrument is configured by storing, on the test instrument, the real-time application to implement the communication protocol, to identify the event, and to execute the bytecode.

22. The method of claim 13, wherein the memory stores multiple instance of bytecode that are executable, the test instrument being configured to execute an instance of bytecode in response to a single occurrence of the event.

23. The method of claim 14, wherein the human-readable code is written in a scripting language.

24. The method of claim 13, wherein the test computing system comprises multiple computing devices.

* * * * *